(12) United States Patent
Taylor

(10) Patent No.: US 6,902,287 B2
(45) Date of Patent: Jun. 7, 2005

(54) ENVIRONMENTALLY CONTROLLED APPLIANCE ENCLOSURE

(75) Inventor: John D. Taylor, Waterford, MI (US)

(73) Assignee: Safety Technology International, Inc., Waterford, MI (US)

( * ) Notice: Subject to any disclaimer, the term of this patent is extended or adjusted under 35 U.S.C. 154(b) by 0 days.

(21) Appl. No.: 10/294,161
(22) Filed: Nov. 14, 2002

(65) Prior Publication Data
US 2004/0095747 A1 May 20, 2004

(51) Int. Cl.[7] ............................................. F21D 21/08
(52) U.S. Cl. .......................... 362/92; 362/264; 362/267
(58) Field of Search ............................ 362/92, 294, 218, 362/547, 264, 267, 373

(56) References Cited

U.S. PATENT DOCUMENTS

| | | | | |
|---|---|---|---|---|
| 3,028,475 A | * | 4/1962 | Nash | 219/201 |
| 4,320,949 A | | 3/1982 | Pagano | 354/81 |
| 4,681,024 A | * | 7/1987 | Ivey | 454/233 |
| 4,728,775 A | | 3/1988 | Van Straten | 219/202 |
| 5,577,834 A | | 11/1996 | Mazies et al. | 362/302 |
| D428,602 S | | 7/2000 | Taylor | D13/177 |
| D432,503 S | | 10/2000 | Taylor | D13/177 |
| 6,239,435 B1 | | 5/2001 | Castleman | 250/339.15 |
| 6,352,358 B1 | * | 3/2002 | Lieberman et al. | 362/294 |
| 6,450,088 B1 | * | 9/2002 | Hutchinson | 100/320 |

FOREIGN PATENT DOCUMENTS

| | | | |
|---|---|---|---|
| EP | 92302188.5 | 3/1992 | G08B/29/10 |
| EP | 94630002.7 | 1/1994 | F21P/1/00 |

OTHER PUBLICATIONS

Technical Data Bulletin SL 30198 CHEMETRON Fire Systems–Alarm Strobe Light–Mar. 1998 *amseco—american security equipment company*—SAD24–75110—Jan., 2002 FA/S–62 Models 623x/625x DC Mechanical Horns & Horn Strobes—May, 1999 STI–1229HTR / STI–HK2—Inst. Sht. 1229HTR IS—Aug., 2002.

* cited by examiner

*Primary Examiner*—Sandra O'Shea
*Assistant Examiner*—Guiyoung Lee
(74) *Attorney, Agent, or Firm*—Gifford, Krass, Groh, Sprinkle, Anderson & Citkowski, P.C.

(57) ABSTRACT

An environmentally controlled appliance enclosure includes an enclosed spacer and a heater assembly positioned within the spacer. A heater unit and a fan are secured to the heater assembly. A mounting plate is positioned on the assembly mount and an appliance is secured to the mounting plate. A cover is secured to the spacer to enclose the appliance. Once sealed, the heater unit and fan of the heater assembly operate to maintain a uniform temperature within the enclosure.

39 Claims, 3 Drawing Sheets

ENVIRONMENTALLY CONTROLLED APPLIANCE ENCLOSURE

BACKGROUND OF THE INVENTION

1. Field of the Invention

The present invention is directed to an appliance enclosure. More particularly, the invention concerns an appliance enclosure having a heater assembly that maintains a uniform temperature within the enclosure.

2. Reference to Related Art

Appliances such as emergency horns and strobe lights and the covers for those appliances are well known in the art. For example, the STI-1210 Series horn and strobe enclosures manufactured by Safety Technology, Inc. of Waterford, Mich., are known to include a spacer that may be mounted on a wall or similar surface and a transparent plastic cover that is secured to the spacer. A gasket may be provided in a joint between the spacer and cover to provide a waterproof seal.

Another commercially available product is the FARADAY® Model 2705 weatherproof strobe. This device uses a waterproof backbox for waterproof applications.

U.S. Pat. No. 4,320,949 is directed to a weatherized housing assembly for a camera. The weatherized housing includes a unitary plastic molded opaque housing that is generally shaped in the form of a frusto-conical inverted cup. A camera is positioned in the housing and a cover or dome is secured to the housing to enclose the camera. A fan is secured to an opening in the housing. Furthermore, a pair of electrical resistance heaters is positioned within the housing. If the temperature in the housing becomes too high, the fan is activated and circulates the air within the housing. If the temperature within the housing approaches freezing, a thermostatic switch in the housing is closed to energize the heaters to heat the air within the housing. Finally, a lamp can be provided on the exterior of the housing.

SUMMARY OF THE INVENTION

The present invention is directed to an environmentally controlled appliance enclosure. The enclosure includes an enclosed spacer and a heater assembly positioned within the spacer. A heater unit(s) and fan are secured to the heater assembly. An appliance, such as a strobe light, is secured to an appliance mounting plate that is affixed to the heater assembly. Finally, a transparent plastic cover is secured to the spacer to thereby enclose the appliance. Once sealed, the heater unit(s) and fan of the heater assembly operate to maintain a uniform temperature within the enclosure.

Particularly preferred applications for the present invention include, but are not limited to, refrigerators, freezers, meat packaging plants, arctic environments, ocean rigs, slaughterhouses, etc. The enclosure of the present invention will also advantageously prevent build up of snow or the entry of moisture in wash-down areas to assure that the appliance (particularly strobes) remains clearly visible.

BRIEF DESCRIPTION OF THE DRAWINGS

A better understanding of the present invention will be had upon reference to the attached drawings wherein like reference numerals refer to like parts throughout and wherein.

DETAILED DESCRIPTION

Figure 1:
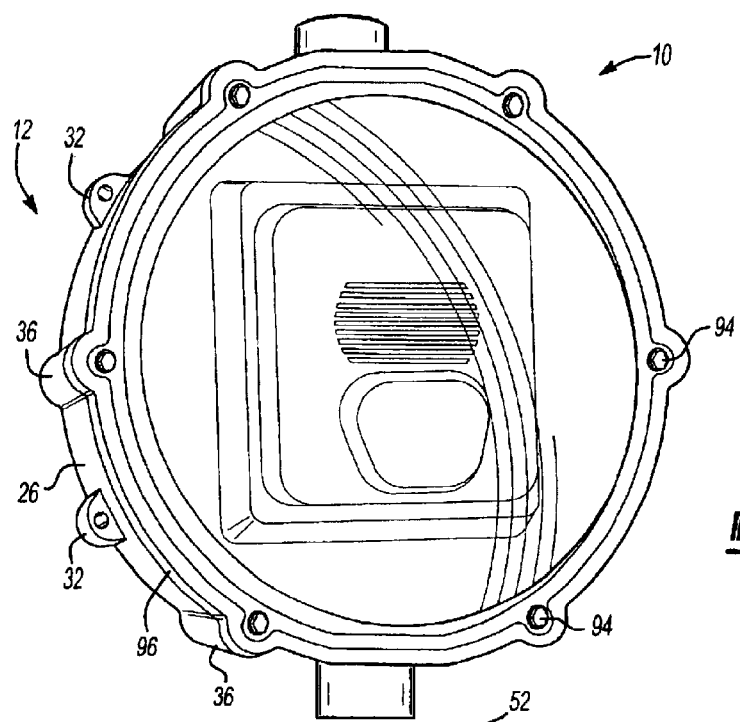
FIG. 1, is a perspective view of an environmentally controlled appliance (with attached appliance) constructed in accordance with a preferred embodiment of the present invention.
Figure 2:
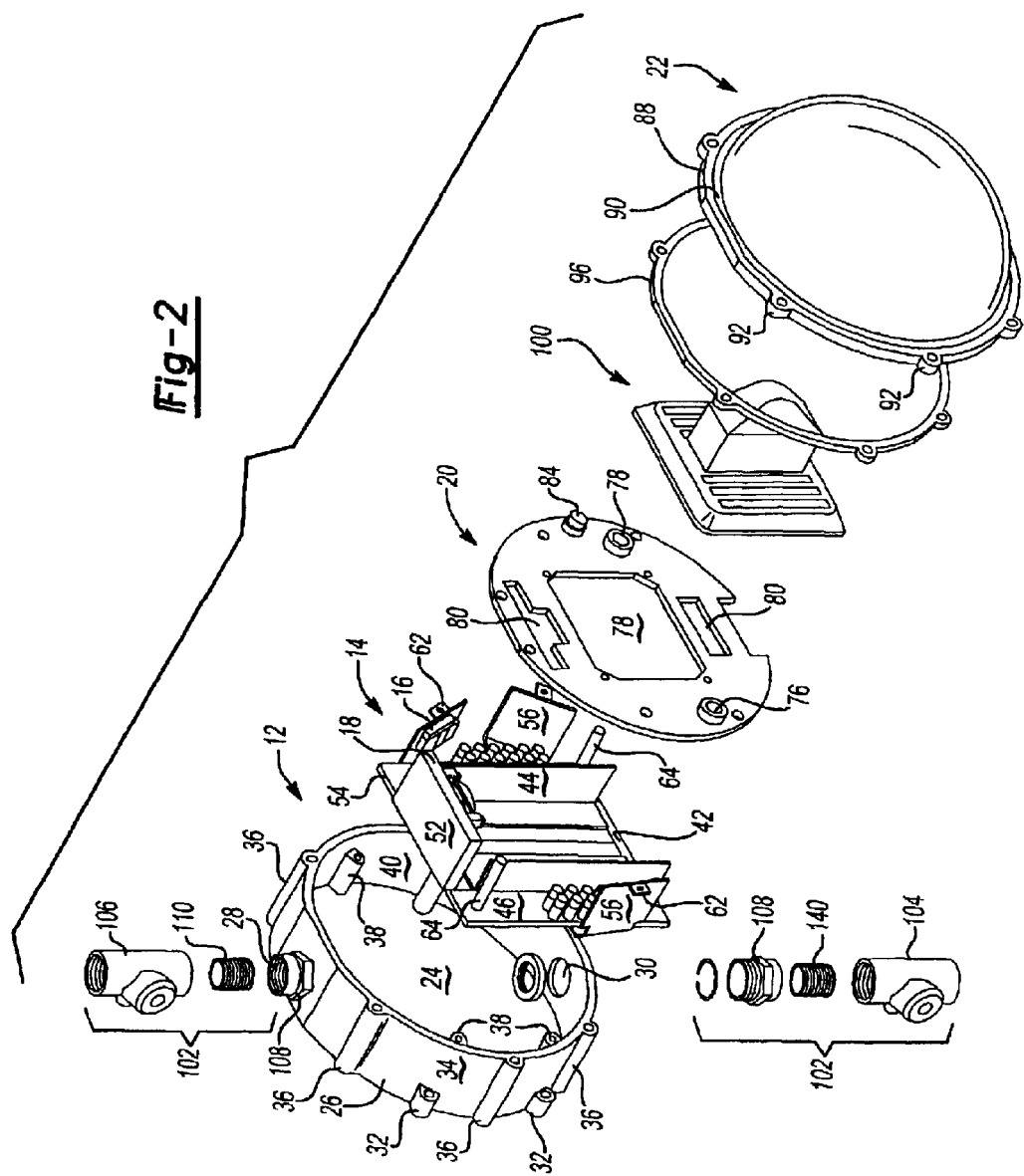
FIG. 2, is an exploded perspective view of enclosure of in FIG. 1.

Referring now to FIGS. 1 and 2, there is shown an environmentally controlled appliance enclosure 10 constructed in accordance with the present invention. Preferably, the enclosure 10 includes a spacer or "backbox" 12, a heater assembly 14 positioned within the spacer 12, a heater unit(s) 16 and a fan 18 that are each secured to the heater assembly 14, an appliance mounting plate 20 that is secured to the heater assembly 14 and spacer 12 for use in mounting an appliance 100 and a cover 22 that is secured to the spacer 12.

Still referring to FIGS. 1 and 2, and as best shown in FIG. 2, the spacer 12 is an enclosed spacer having a circular base 24 and a wall 26 that extends from the base 24. The space 12 is preferably constructed of a polycarbonate material. However, it will be appreciated that other materials having the requisite characteristics of formability and strength, including composites, plastics, metals, alloys, etc. may also be used in the construction of the spacer 12. The circular base 24 and wall 26 of the spacer 12 each have a preferred thickness in the range of 0.1–0.3 inches. In a particularly preferred embodiment, the circular base 24 has a thickness of 0.125 inches and the wall 26 has a thickness of 0.2 inches.

Referring now to FIG. 2, a pair of apertures 28, 30 are defined in the wall 26 in an opposed relationship to each other. The apertures 28, 30 permit a user to secure conduit connectors 102 for separate high (through aperture 30) and low (through aperture 28) voltage lines (not show) to the enclosure 10. The conduit connectors 102 preferably include a high 104 and low 106 voltage sealing hub, a pair of rain tight hubs 108 and a pair of nibbles 110 for securing the sealing hubs 104, 106 to the rain tight hubs 108.

Still referring to FIG. 2, a plurality of internally threaded spacer mounts 32 are provided along the exterior surface 34 of the wall 26 of the spacer 12, proximate the circular base 24 for use in fixing the spacer 12 to a wall (not shown) or similar surface through the use screws (not shown) or the like. Likewise, a plurality of internally threaded cover mounts 36 are positioned along the exterior surface 34 of the wall 26 of the spacer 12 and, as discussed below, are used for securing the cover 22 to the spacer 12. Finally, a plurality of internally threaded assembly mounts 38 are positioned along an interior surface 40 of the wall 26 of the spacer 12 for use in securing the heater assembly 14 and the appliance mounting plate 20 to the spacer 12.

Figure 3:
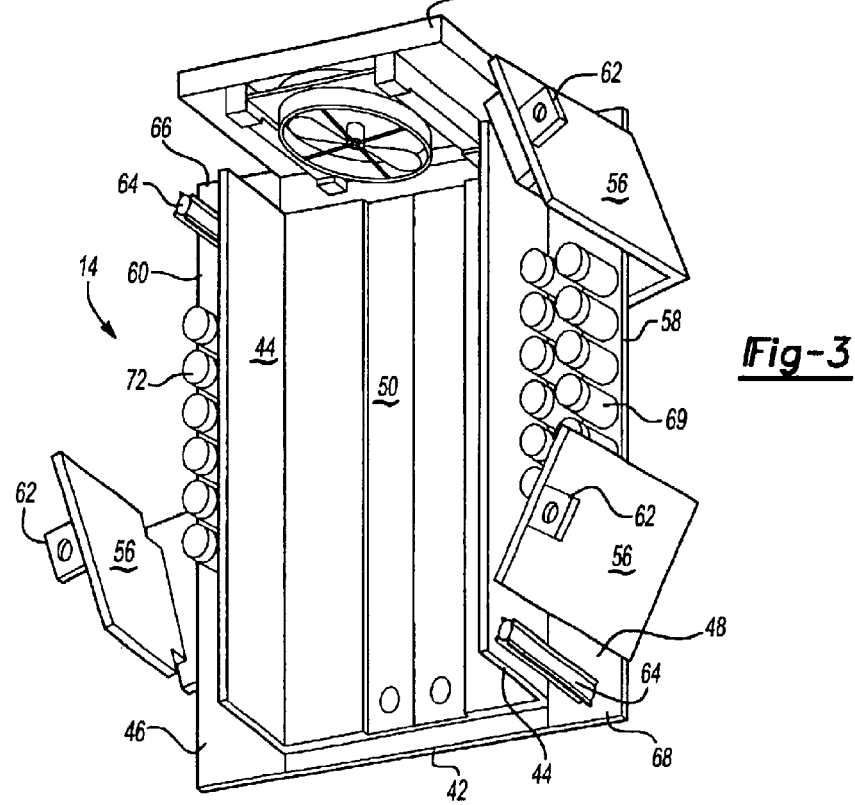
FIG. 3, is a perspective view of the heater assembly of the enclosure of in FIG. 1.

Referring now to FIGS. 2 and 3, the heater assembly 14 is positioned within the space 12 on the circular base 24. As best shown in FIG. 3, the heater assembly 14 includes a base plate 42 and a pair of longitudinally extending flanges 44 that extend from the base plate 42. The longitudinally extending flanges 44 divide the base plate into a first 46 and a second 48 side portion and a center portion 50. A support plate 52 extends from the base plate 42 near the top 54 of the base plate 42 and perpendicular to the longitudinally extending flanges 44. A pair of L-shaped mounting arms 56 is secured to the side 58 of the base plate 42 along the first side portion 46. A third L-shaped mounting arm 56 is secured to the side 60 of the base plate 42 along the second side portion 48. Each mounting arm 54 is preferably secured at an angle to the base plate 42 so that the entire heater assembly 14 may be positioned within the spacer 12. Additionally, each mounting arm 56 includes a threaded flange 62 for use in securing the mounting arms 56 (and thus the heater assembly 14) to the threaded assembly mounts 38 of the spacer 12. A pair of stand-offs 64 extend from opposing corners 66, 68 of the base plate 42 and support the appliance mounting plate 20.

Figure 4:
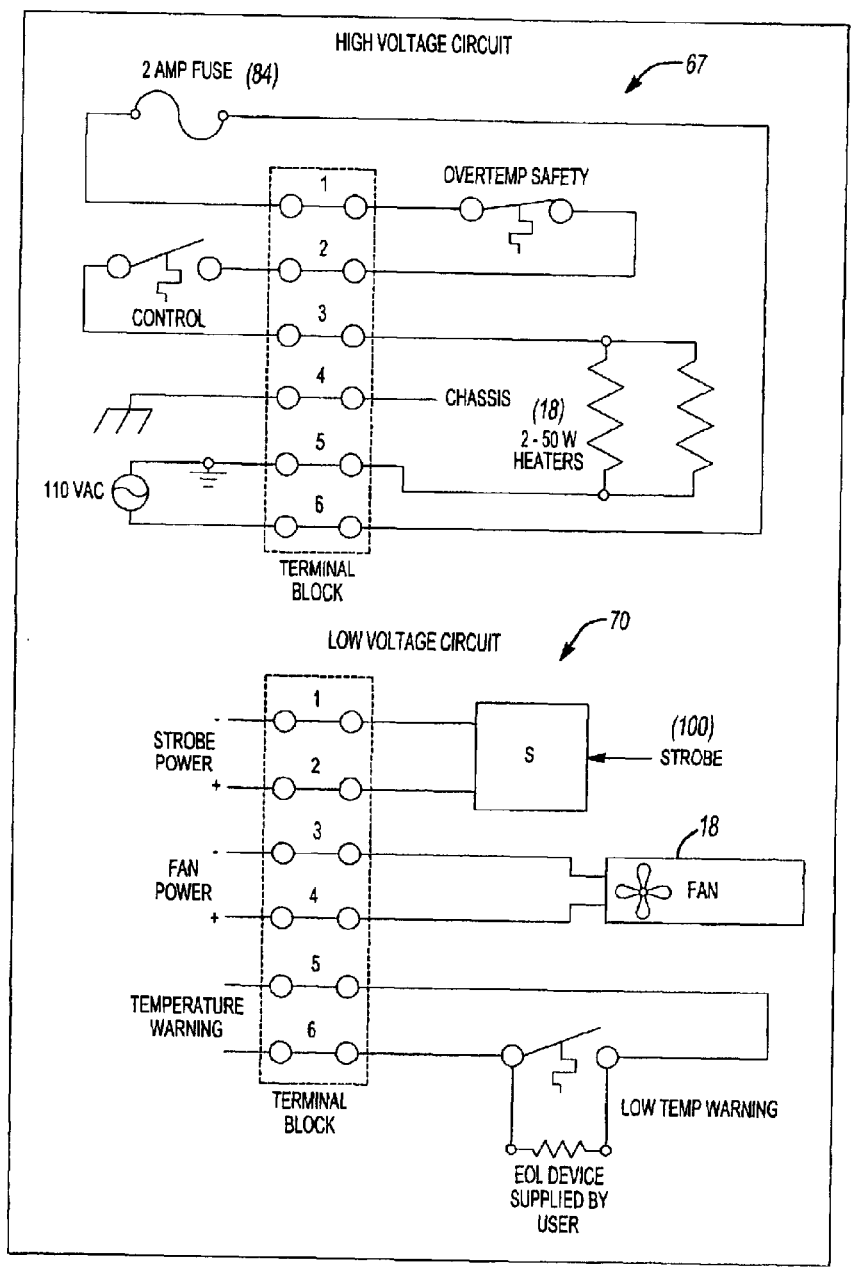
FIG. 4, is a schematic view of the high and low voltage circuits for the enclosure of FIG. 1.

Still referring to FIGS. 2–4, the heater unit(s) 16 is secured to a mounting arm 56 of the heater assembly 14 and electrically connected to the high voltage circuit 67 of the high voltage terminal block 69. The heater unit 16 is preferably a silicone laminate heater. However, in a particularly preferred embodiment, a pair of 50 watt silicone laminate heater units are used. In operation, the heater unit(s) 16 cycle as required to maintain the correct range of operating temperatures inside the enclosure 10.

Still referring now to FIGS. 2–4, the fan 18 is secured to the support plate 52 of the heater assembly 14 and is electrically connected to the low voltage circuit 70 of the low voltage terminal block 72. Preferably, the fan 18 is a 24 VDC, 90 mA fan with a life of at least five years of continuous duty. In operation, the fan 18 runs continuously to maintain a uniform temperature inside the enclosure 10.

Still referring to FIGS. 2–4, the low voltage terminal block 70 and a high voltage terminal block 69 are positioned on the first 46 and second 48 side portions, respectively, of the heater assembly 14. High and low voltage wiring entering the spacer 12 of the enclosure 10 through the apertures 28,30 is thus connected to the high or low terminal block to supply power (see FIG. 4) to the heater unit(s) 16, fan 18, the appliance 100, the control thermostat 74 and/or the low temperature thermostat 76 (as discussed below).

Referring now to FIG. 2, the appliance mounting plate 20 is secured over the heater assembly 14 and to the assembly mounts 38 of the spacer 12. The appliance mounting plate 20 includes a central aperture 78 that is alignable with the center portion 50 of the base plate 42 of the heater assembly 14. This arrangement allows electrical wiring (not shown) to be extended to the appliance 100 and also creates an open space within the enclosure for the circulation of air by the fan 18.

A cutout 80 in the appliance mounting plate 20 is shaped to accept and be securable around the support plate 52 of the heater assembly 14. A warning label 82 or similar indicia may be provided on the appliance mounting plate 20 so as to provide information to the user (e.g., installation/repair dates). A low temperature thermostat 76 is positioned on one side of the appliance mounting plate. As best shown in FIG. 4, the low temperature thermostat preferably makes a circuit at +32 F (0 C) and clears the circuit at +50 F (+10 C). A control thermostat 76 is positioned on a side of the appliance mounting plate 20 opposite the low temperature thermostat 76. The control thermostat 74 is operable to set a desired temperature level at which to maintain the enclosure. A fuse 84, preferably a 2-amp fuse, is also positioned on the appliance mounting plate 20 above the control thermostat 74. As best shown in FIG. 4, the fuse 84 is electrically connected to the high voltage circuit 67.

Referring now to FIG. 2, an appliance 100 is secured to the appliance mounting plate 20 over the central aperture 78. Preferably, the appliance 100 is a light-emitting device (e.g., a strobe light). Particularly preferred strobe lights include the Select-A-Strobe Series from AMESCO, the 2700 Series by FARADAY®, or the Commander Series by Gemtex.

Referring now to FIGS. 1 and 2, the cover 22 is a dome-shaped cover that is positionable over the appliance 100. The cover 22 has a flange 88 that extends from the rim 90 of the cover 22 and includes a plurality of threaded mounting holes 92. In operation, the mounting holes 92 are aligned with the cover mounts 36 of the spacer 12 with the two parts then being secured together by screws 94 (see FIG. 1). The cover 22 is preferably a transparent polycarbonate cover having a thickness in the range of 0.1 to 0.3 inches. In a particularly preferred embodiment, the cover 22 has a thickness of 0.2 inches.

Still referring to FIG. 2, a neoprene gasket 96 is positioned in the joint between the cover 22 and the spacer 12 to assist in sealing the enclosure 10.

It should be understood that the invention encompasses various modifications and alternative forms of embodiments. It should also be understood that these specific embodiments are not intended to limit the invention, but are intended to cover all modifications, equivalents and alternatives falling within the scope of the claims.

I claim:

1. An environmentally controlled appliance enclosure comprising:
   a spacer;
   a cover secured to the spacer;
   a gasket positioned between the spacer and the cover, the spacer, the cover and the gasket defining an enclosed area that is sealed from an external environment;
   a heater assembly positioned within the enclosed area, the heater assembly including a heater, a fan, a high voltage circuit electrically connected to the heater and a low voltage circuit electrically connected to the fan, the heater assembly being operable to maintain a uniform temperature within the enclosed area; and
   an appliance positioned within the enclosed area.

2. The enclosure of claim 1, wherein said spacer is an enclosed spacer.

3. The enclosure of claim 2, wherein said enclosed spacer includes a circular base and a wall extending from said circular base.

4. The enclosure of claim 3, further comprising a pair of conduit connectors and the wall extending from the circular base defining a pair of apertures, each conduit connector being secured to the wall in alignment with one aperture of the pair of apertures.

5. The enclosure of claim 1, wherein the appliance is a light emitting device.

6. The enclosure of claim 5, wherein the light emitting device is a strobe light.

7. The enclosure of claim 1 wherein the cover is transparent.

8. The enclosure of claim 1, wherein the gasket comprises a neoprene gasket.

9. The enclosure of claim 1, further comprising a thermostat positioned within the enclosed area that is operable to activate the heater.

10. The enclosure of claim 9, wherein the thermostat comprises a low temperature thermostat.

11. The enclosure of claim 1, wherein the heater comprises a silicone laminate heater.

12. The enclosure of claim 1, further comprising a high voltage terminal block secured to the heater assembly.

13. The enclosure of claim 1 further comprising a low voltage terminal block secured to the heater assembly.

14. An environmentally controlled appliance enclosure comprising:
   a spacer;
   a cover secured to the spacer;

a gasket positioned between the spacer and the cover, the spacer, the cover and the gasket defining an enclosed area that is sealed from an external environment;

a heater assembly positioned within the enclosed area, the heater assembly including a heater, a fan, a high voltage circuit and a low voltage circuit;

an appliance mounting plate positioned on the heater assembly; and an appliance positioned on the appliance mounting plate.

15. The enclosure of claim 14, wherein the spacer is an enclosed spacer.

16. The enclosure of claim 15, wherein the enclosed spacer includes a circular base and a wall extending from the circular base.

17. The enclosure of claim 16, further comprising a pair of conduit connectors and the wall extending from the circular base defining a pair of apertures, each conduit connector being secured to the wall in alignment with one aperture of the pair of apertures.

18. The enclosure of claim 17, wherein the appliance is a light emitting device.

19. The enclosure of claim 18, wherein the light emitting device is a strobe light.

20. The enclosure of claim 14, wherein the cover is transparent.

21. The enclosure of claim 14, wherein the gasket comprises a neoprene gasket.

22. The enclosure of claim 14, further comprising a thermostat positioned within the enclosed area that is operable to activate the heater.

23. The enclosure of claim 22, wherein the thermostat comprises a low temperature thermostat.

24. The enclosure of claim 14, wherein the heater comprises a silicone laminate heater.

25. The enclosure of claim 14, further comprising a fuse positioned on the appliance mounting plate and electrically connected to the high voltage circuit.

26. The enclosure of claim 14, further comprising a high voltage terminal block secured to the heater assembly.

27. The enclosure of claim 14, further comprising a low voltage terminal block secured to the heater assembly.

28. An environmentally controlled appliance enclosure comprising:

a spacer;

a cover secured to the spacer;

a gasket positioned between the spacer and the cover, the spacer, the cover and the gasket defining an enclosed area that is sealed off from an external environment;

a heater assembly positioned within the enclosed area, the heater assembly including a heater, a fan, high voltage circuit and a low voltage circuit, the heater assembly being operable to maintain a uniform temperature within the enclosed area;

a thermostat electrically connected to the heater assembly; and an appliance positioned with the enclosed area.

29. The enclosure of claim 28, wherein the spacer is an enclosed spacer.

30. The enclosure of claim 29, wherein the enclosed spacer includes a circular base and a wall extending from the circular base.

31. The enclosure of claim 30, further comprising a pair of conduit connectors and the wall extending from the circular base defining a pair of apertures, each conduit connector being secured to the wall in alignment with one aperture of the pair of apertures.

32. The enclosure of claim 28, wherein the appliance is a light emitting device.

33. The enclosure of claim 32, wherein the light emitting device is a strobe light.

34. The enclosure of claim 28, wherein the cover is transparent.

35. The enclosure of claim 28, wherein the gasket comprises a neoprene gasket.

36. The enclosure of claim 28, wherein the thermostat comprises a low temperature thermostat.

37. The enclosure of claim 28, wherein the heater comprises a silicone laminate heater.

38. The enclosure of claim 28, further comprising a high voltage terminal block secured to the heater assembly.

39. The enclosure of claim 28, further comprising a low voltage terminal block secured to the heater assembly.

* * * * *